United States Patent
Lee

(10) Patent No.: US 7,109,562 B2
(45) Date of Patent: Sep. 19, 2006

(54) HIGH VOLTAGE LATERALLY DOUBLE-DIFFUSED METAL OXIDE SEMICONDUCTOR

(75) Inventor: Chi-Hsiang Lee, Hsinchu (TW)

(73) Assignee: Leadtrend Technology Corp., (TW)

( * ) Notice: Subject to any disclaimer, the term of this patent is extended or adjusted under 35 U.S.C. 154(b) by 0 days.

(21) Appl. No.: 11/050,742

(22) Filed: Feb. 7, 2005

(65) Prior Publication Data

US 2006/0175658 A1    Aug. 10, 2006

(51) Int. Cl.
*H01L 23/58* (2006.01)
(52) U.S. Cl. .............. 257/488; 257/335; 257/342; 257/341; 257/E29.009; 257/E29.01; 257/E29.256; 257/E29.261
(58) Field of Classification Search ........... 257/340, 257/341, 335, 336, 339, 487, 488, 492, 342
See application file for complete search history.

(56) References Cited

U.S. PATENT DOCUMENTS

| | | | |
|---|---|---|---|
| 4,614,959 A | | 9/1986 | Nakagawa |
| 5,304,827 A | * | 4/1994 | Malhi et al. ............ 257/262 |
| 5,432,370 A | * | 7/1995 | Kitamura et al. .......... 257/339 |
| 6,110,804 A | | 8/2000 | Parthasarathy et al. |
| 6,207,994 B1 | * | 3/2001 | Rumennik et al. ......... 257/342 |
| 6,211,552 B1 | | 4/2001 | Efland et al. |
| 6,252,279 B1 | * | 6/2001 | Kim ..................... 257/335 |
| 6,614,088 B1 | * | 9/2003 | Beasom .................. 257/489 |
| 6,825,531 B1 | * | 11/2004 | Mallikarjunaswamy ...... 257/343 |
| 2004/0195644 A1 | * | 10/2004 | Mallikarjunaswamy et al. . 257/491 |
| 2004/0201078 A1 | * | 10/2004 | Ren ..................... 257/500 |

* cited by examiner

Primary Examiner—Kenneth Parker
Assistant Examiner—Paul Budd
(74) Attorney, Agent, or Firm—Birch, Stewart, Kolasch and Birch, LLP

(57) ABSTRACT

A high voltage laterally double-diffused metal oxide semiconductor (LDMOS) stricture is characterized as follows: the second source electrode metal layer connected to the first source electrode metal layer protrudes out of a certain length relative to the first source electrode metal layer of the source electrode region connected thereto. The second drain electrode metal layer connected to the first drain electrode metal layer protrudes out of a certain length relative to the first drain electrode metal layer of the drain electrode region. The protruded length overlaps more portions of the drift layer than the first source electrode metal layer and the first drain electrode metal layer disposed below, to reduce the electric field concentration of the gate electrode interface or the interface between the N+ type drain electrode layer and the N-type extended drift layer.

12 Claims, 5 Drawing Sheets

HIGH VOLTAGE LATERALLY DOUBLE-DIFFUSED METAL OXIDE SEMICONDUCTOR

BACKGROUND OF THE INVENTION

1. Field of the Invention

The invention relates to a semiconductor structure, especially to a high voltage laterally double-diffused metal oxide semiconductor (LDMOS) structure.

2. Related Art

In general the high voltage laterally double-diffused metal oxide semiconductor (LDMOS) structure is a semiconductor structure operated in the high voltage range of 20–700V. It can easily be integrated on a single chip and manufactured in CMOS or BiCMOS process, and is used for accelerating the processing of control, logic and power switching.

For the high voltage LDMOS structure, the surface layer of the junction of its drain electrode tends to generate a high intensity electric field, therefore its breakdown voltage frequently is not capable of meeting the actual requirements. In view of this problem, numerous methods have been utilized to avoid the occurrence of the above-mentioned situation, so as to raise the breakdown voltage. For example, please refer to FIG. 1, which shows the cross section of a conventional high voltage MOS structure. As shown in FIG. 1, the conventional MOS structure includes: a P-type substrate 1, a N+ type drain electrode layer 3, a P-type layer 4, a N-type extended drift layer 5, a source electrode 6, a drain electrode 7, insulator layers 8,8',8'', a gate electrode 9, field plate layers 6',7', and the field plate layers 6',7' and additional field plate layer 10.

In the above-mentioned structure, the N-type extended drift layer 5 and the field plate layer 6' are used to avoid the generation of the field concentration on the edge of the gate electrode 9, and field plate layers 7', 10 are used to reduce the field concentration for the interface between the N+ type drain electrode layer 3 and N-type extended drift layer 5.

In addition, please refer to FIG. 2, which shows one of the several MOS structures as disclosed in U.S. Pat. No. 4,614,959. In this structure, the field plate layers 6',7',10' on different layers are disposed in interleaving arrangement and are utilized to shield the N-type extended drift layer 5, thus to further reduce the electric field concentration.

From the above example, it is evident that one of the urgent problems pending to be solved is how to reduce the field concentration generated by the gate electrode interface or the interface between the N+ type drain electrode layer 3 and the N-type extended drift layer 5, so as to obtain a high voltage LDMOS structure, having a high breakdown voltage and low on resistance.

SUMMARY OF THE INVENTION

In view of the above-mentioned problems and shortcomings of the prior art, the object of the invention is to provide a high voltage laterally double-diffused metal oxide semiconductor (LDMOS) structure, having a high breakdown voltage and low on resistance. As such the said structure is capable of reducing the field concentration generated by the gate electrode interface or the interface between the N+ type drain electrode layer and the N-type extended drift layer 5, thus raising the reliability of the said semiconductor structure.

To achieve the above-mentioned objective, the invention provides a high voltage laterally double-diffused metal oxide semiconductor (LDMOS) structure, comprising: a semiconductor layer having the first conductive type; a drift layer having the second conductive type and formed in the conductive layer. The drift layer extends downwards from the surface of the semiconductor layer; a source electrode region having the second conductive type is formed in the semiconductor layer, including a first region extending downwards from the surface of the semiconductor layer, and a second region enclosing the first region, wherein the doping concentration of the first region is greater than that of the second region; a channel region, disposed between the source electrode region and the first edge of the drift layer; a drain electrode region of the second conductive type formed in the semiconductor layer, and adjacent to the second edge of the said drift layer; a first insulation layer formed on the semiconductor layer; a first gate electrode formed on the first insulation layer; a second gate electrode formed on the first insulation layer and separated from the first gate; a second insulation layer and a third insulation layer formed on the first gate electrode and the second gate electrode and overlapping each other; a first source electrode metal layer, connected to the source electrode region and located over the first gate electrode, which is disposed between the second insulation layer and the third insulation layer, and another second source electrode metal layer is connected to the first source electrode metal layer extending on the third insulation layer. The second source electrode metal layer protrudes a certain length relative to the first source electrode metal layer and overlaps a portion of the drift layer; and a first drain electrode metal layer, connected to the drain electrode region and located over the second gate electrode, which is disposed between the second insulation layer and the third insulation layer. Another second drain electrode metal layer is connected to the first drain electrode metal layer extending on the third insulation layer, the second drain electrode metal layer protrudes a certain length relative to the first drain electrode metal layer and overlaps a portion of the said drift layer.

In addition, the above-mentioned drain electrode region may also include a third region extending downwards from the surface of the semiconductor layer, and a fourth region enclosing the third region, wherein the doping concentration of the third region is greater than that of the fourth region.

In the above description, the first conductive type is a P type, and the second conductive type is an N type.

The characteristics and implementation of the invention will be described in detail with reference to the preferred embodiments in conjunction with the attached drawings.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAIL DESCRIPTION OF THE INVENTION

Figure 3:
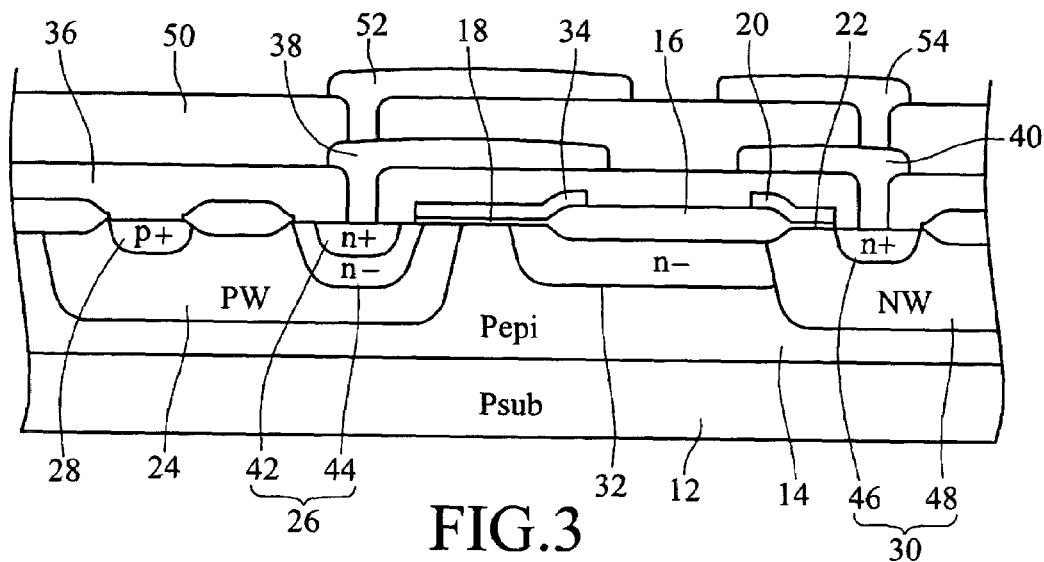
FIG. 3 is an LDMOS structure according to the first embodiment of the invention.

Please refer to FIG. 3, which shows the LDMOS structure according to the first preferred embodiment of the present invention.

As shown in FIG. 3, the said LDMOS structure is formed in P-type epitaxy layer 14 on top of a P-type substrate 12. A LOCOS field oxide layer 16, the gate oxide layers 18, 22 are formed on the surface of P-type epitaxy layer 14. The LDMOS structure includes a P well 24 in the epitaxy layer 14. The N source electrode region 26 and a p+ region 28 are both in P well 24, the LDMOS structure includes additionally an N drain electrode region 30 and an N-type drift layer 32. The said drift layer 32 extends downwards from the surface of the said P-type epitaxy layer 14, thus forming the region between the N source electrode region 26 and the N drain electrode region 30 and is aligned with the LOCOS field oxide layer 16. A channel region is formed between the N source electrode region 26 and the drift layer 32.

The gate electrodes 20, 34 are formed on gate oxide layers 18, 22 and a part of the LOCOS field oxide layer region 16. The additionally field plate layer 20 is formed on a part of the LOCOS field oxide layer region 16 and the gate electrode 20 of the oxide layer 22.

A first insulation layer 36 and a second insulation layer 50 are formed on top of the gate electrodes 20, 34.

The characteristics of the LDMOS structure are: the first source electrode metal layer 38 is connected to the N source electrode region 26, and the second source electrode metal layer 52 is connected to the first source electrode metal layer 38. The first source electrode metal layer 38 extends between the first insulation layer 36 and the second insulation layer 50, and the second source electrode metal layer 52 extends on the second insulation layer 50. In addition, the length of the first source electrode metal layer 38 protrudes out of the edge of gate electrode 34, and the length of the second source electrode metal layer 52 protrudes out of the edge of the first source electrode metal layer 38. As such, longitudinally, the second source electrode metal layer 52 overlaps a part of the drift layer 32, more than the first source electrode metal layer 38 does.

On the other hand, the characteristics of the LDMOS structure include: the first drain metal layer 40 connected to the N drain region 30, and the second drain metal layer 54 connected to the first drain electrode metal layer 40. The first drain metal layer 40 extends between the first insulation layer 36 and the second insulation layer 50 and towards the direction of gate electrode 34, the second drain electrode metal layer 54 extends on the second insulation layer 50. In addition, the length of the first drain electrode metal layer 40 protrudes out of the edge of gate electrode 20, and the length of the second drain electrode metal layer 54 protrudes out of the edge of the first drain electrode metal layer 40. As such, longitudinally, the second drain electrode metal layer 54 overlaps a part of the drift layer 32, more than the first drain electrode metal layer 40 does.

The said N source electrode region 26 may include an n+ region 42, extending downwards from the surface of P-type epitaxy layer 14 and an n-region 44 enclosing the n+ region 42.

On the other hand, the said N drain electrode region 30 may also include an n+ region, 46 extending downwards from the surface of the P-type epitaxy layer 14, and an N well, enclosing the n+ region 46.

The above-mentioned method of forming the LDMOS structure includes for example the following steps: first forming P-type epitaxy layer 14 on the P-type substrate 12, utilizing a photolithographic process to form the P well 24, the N well 48, n-source electrode region 44 and the n-type drift layer 32 in the P-type epitaxy layer 14 in conjunction with ion implantation, thus forming the LOCOS field oxide 16 over the drift layer 32. Then the gate oxide layers 18, 22 are formed on the surface of P-type epitaxy layer 14. Then forming a polysilicon layer on top of the gate oxide layers 18, 22 and field oxide layer 16, and forming the gate electrodes 34, 20 by means of a photolithographic process in conjunction with the etching process.

In addition, the photolithographic process is used in conjunction with an ion implementation to form: the p+ region 28 in the P well, the n+ region 42 in the n-region 44, the N well 48 in the N drain electrode region 30, and the n+ region 46 in the N well 48.

Next, the first insulation layer 36 is formed on a substrate containing the gate electrode 34, the photolithographic and the etching processes are used to form on the first insulation layer 36, the first source electrode metal layer 38 and the first drain electrode metal layer 40 which are connected respectively to the source electrode region 26 and the drain electrode region 30. The extension portion of metal layer on the first insulation layer is defined by the photolithographic process.

Subsequently, a second insulation layer 50 is formed on a substrate having a first source electrode metal layer 38 and a first drain metal layer 40. Photolithographic and etching processes are used to form the second source electrode metal layer 52 and the second drain electrode metal layer 54 on the second insulation layer 50. The second source electrode metal layer 52 and the second drain electrode metal layer 54 are connected respectively to the first source electrode metal layer 38 and first drain electrode metal layer 40. The extension portion of the metal layer on the second insulation layer 50 is defined by the photolithographic process.

The ions selected to use in the above-mentioned ion implementation process are for example Ar or B. Since the methods utilized to form the P well, p+ region, n-region, N well, n+ region and n-type drift layer in specific regions are prior arts, they will not be repeated here for brevity's sake.

The above-mentioned gate electrodes 34, 20 are for example made of polysilicon. Please refer to FIG. 4, which shows the LDMOS structure according to the second preferred embodiment of the invention. Wherein all the components used are the same as those in FIG. 3 except for the addition of an insulation layer and a metal layer, therefore, similar reference numbers are used for similar components.

Figure 4:
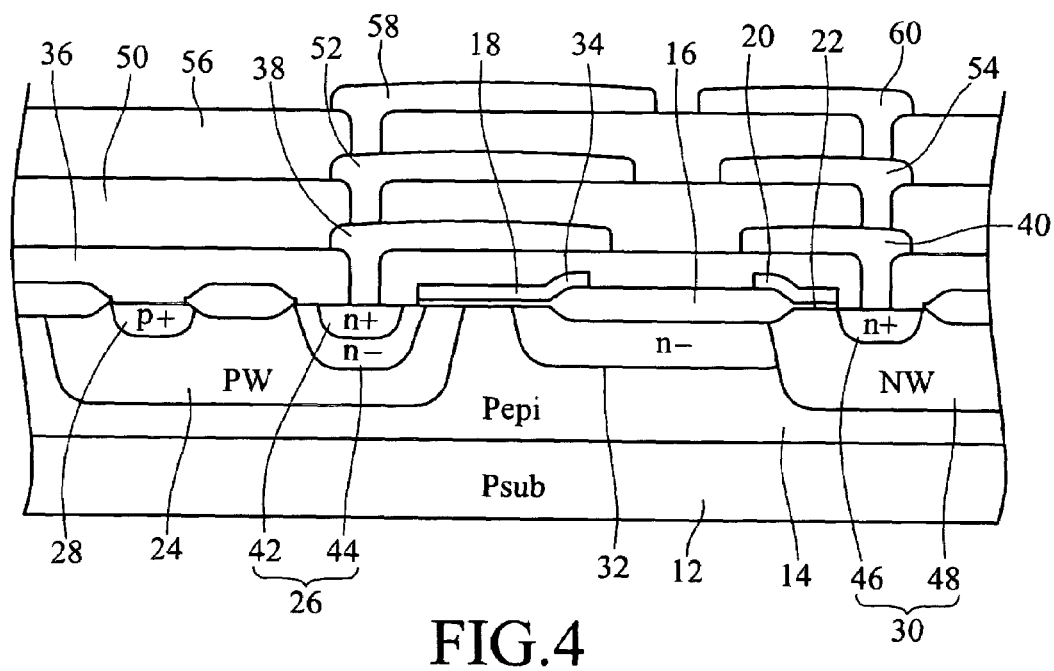
FIG. 4 is an LDMOS structure according to the second embodiment of the invention.

In the LDMOS structure, a third insulation layer 56 is coated on the second source electrode metal layer 52 and the second drain electrode metal layer 54. As shown in FIG. 4, in addition to the first source electrode metal layer 38 that connected to the N source electrode region 26, the first drain electrode metal layer 40 that connected to the N drain electrode area 30, the second source electrode metal layer 52 that connected to the first source electrode metal layer 38, and the second drain electrode metal layer 54 that connected to the first drain electrode metal layer 40, the second preferred embodiment further comprises the third source electrode metal layer 58 that connected to the second source electrode metal layer 52, and extending laterally over the third insulation layer, 56 which is on the gate electrode 34, with its length protruding out of the edge of the second source electrode metal layer 52, and further overlapping more portions of drift layers 32 than the second source electrode metal layer 52.

The second embodiment further includes the third drain electrode metal layer 60 connected to the second drain metal layer 54, extending laterally on the third insulation layer 56 in the direction towards the gate electrode 34, with its length protruding out of the edge of the second drain electrode metal layer 54, and further overlapping more portions of the drift layer 32 than the second drain electrode metal layer 52.

The LDMOS structure shown in FIG. 4 is only provided with one more metal layer than that as shown in FIG. 3. Besides, their manufacturing processes are similar; therefore, it will not be repeated here for brevity's sake.

In the above-mentioned LDMOS structure, though each source electrode metal layer and each drain electrode metal layer extend towards each other, yet they do not touch each other. Namely, each source electrode metal layer and drain electrode metal layer have their preferable extension length. For example, the preferred extension length of the first source electrode metal layer protruding the gate is 5–20% of the length of the drift layer, and the preferred extension length of the first drain electrode metal layer protruding the gate is 5–20% of the length of the drift layer; or the preferred extension length of the second source electrode metal layer protruding the first source electrode is 5–20% of the length of the drift layer, and the preferred extension length of the second drain electrode metal layer protruding the first drain electrode is 5–20% of the length of the drift layer.

Though the 2-layer and 3-layer semiconductor structures are taken as an example in the above description, yet these should not be constructed as the limits in practical applications.

The LDMOS structures in FIGS. 5–8 are the specific structure provided by the invention to meet the low to middle voltage requirement, for example 5–40 V, of the source electrode region.

Figure 5:
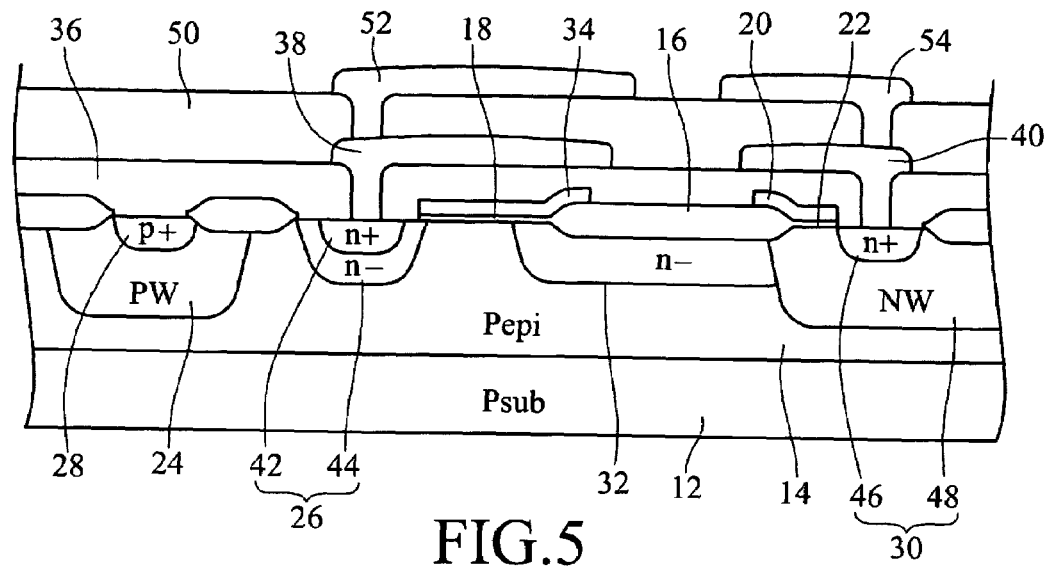
FIG. 5 is an LDMOS structure defined by source electrode region variation according to the first embodiment of the invention.

Please refer to FIG. 5, which shows the LDMOS structure defined by the source electrode region variations according to the first preferred embodiment of the invention.

As shown in FIG. 5, except for the source electrode region, the other elements such as the drain electrode region of the LDMOS structure are similar to those as shown in FIGS. 3 and 4, as such they will not be repeated here for brevity's sake. In addition, similar numerals are utilized for the elements similar to those as shown in the previous drawings.

The above-mentioned LDMOS structure is formed in the P-type epitaxy layer 14, located on the P-type substrate 12.

The characteristics of this particular LDMOS structure are: the said p+ region 28 is located in the P well 24, which encircles the said p+ region 28 and is separated from the N source electrode region 26. The said N source electrode region 26 may include an n+ region 42 extending downwards from the surface of the said P-type epitaxy layer 14, and an n-region 44 encircling the said n+ region 42.

Figure 6:
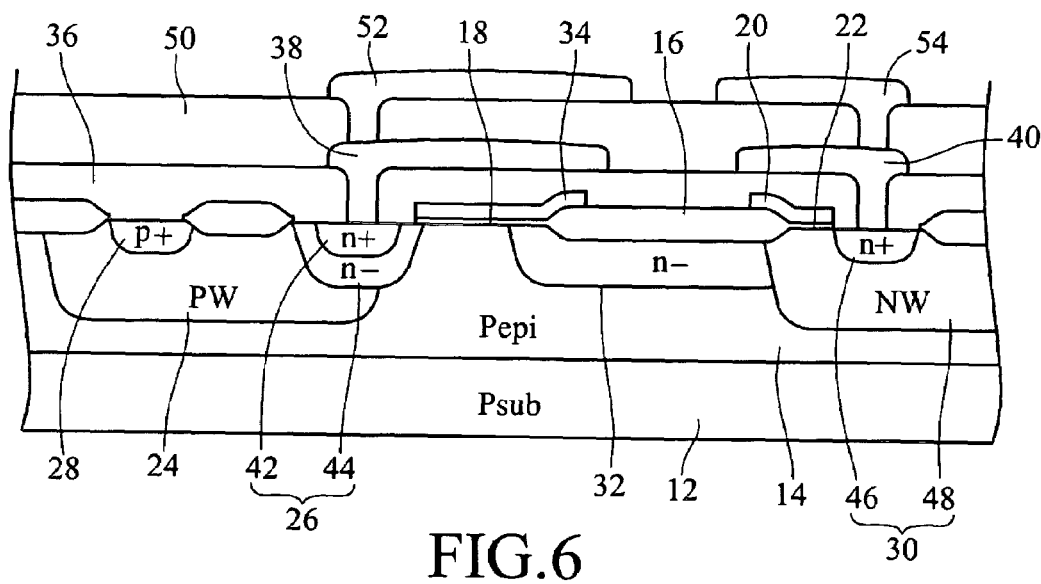
FIG. 6 is an LDMOS structure defined by source electrode region variation according to the second embodiment of the invention.

Please refer to FIG. 6, which shows the LDMOS structure defined by source electrode region variations according to the second preferred embodiment of the invention.

As shown in FIG. 6, except for the source electrode region, the other elements such as a drain electrode region of the LDMOS structure are similar to those as shown in FIGS. 3 and 4, as such it will not be repeated here for brevity's sake. In addition, similar numerals are utilized for the elements similar to those as shown in the previous drawings.

The above-mentioned LDMOS structure is formed in the P-type epitaxy layer 14 located on the P-type substrate 12.

The characteristics of this particular LDMOS structure are: the said p+ region 28 and part of the N source electrode region 26 are located in the P well 24, namely, the P well 24 encircles the said p+ region 28 and part of the N source electrode region 26. Besides, the said N source electrode region 26 may include an n+ region 42 extending downwards from the surface of the said P-type epitaxy layer 14, and an n-region 44 encircling the said n+ region 42.

Figure 7:
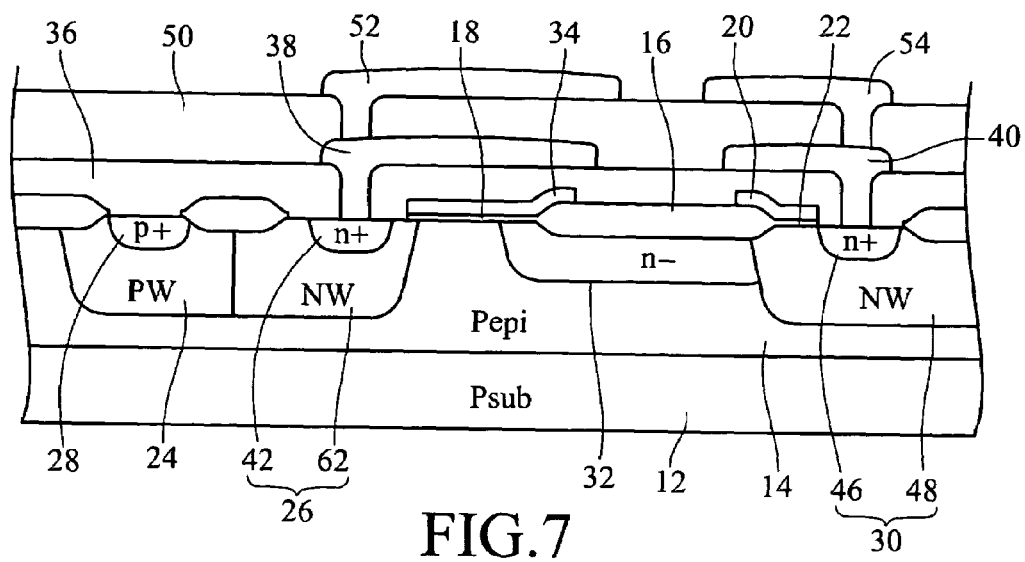
FIG. 7 is an LDMOS structure defined by source electrode region variation according to the third embodiment of the invention.

Please refer to FIG. 7, which shows the LDMOS structure defined by the source electrode region variations according to the third embodiment of the invention.

As shown in FIG. 7, except for the source electrode region, the other elements such as the drain electrode region of the LDMOS structure are similar to those as shown in FIGS. 3 and 4, as such they will not be repeated here for brevity's sake. In addition, similar numerals are utilized for the elements similar to those as shown in the previous drawings.

The above-mentioned LDMOS structure is formed in the P-type epitaxy layer 14, located on the P-type substrate 12.

The characteristics of this particular LDMOS structure are: the said p+ region 28 is located in the P well 24, which is adjacent to the N source electrode region 26; in addition, the said N source electrode region 26 may include a n+ region 42 extending downwards from the surface of the said P-type epitaxy layer 14, and an N well 62 encircling the said n+ region 42.

Figure 8:
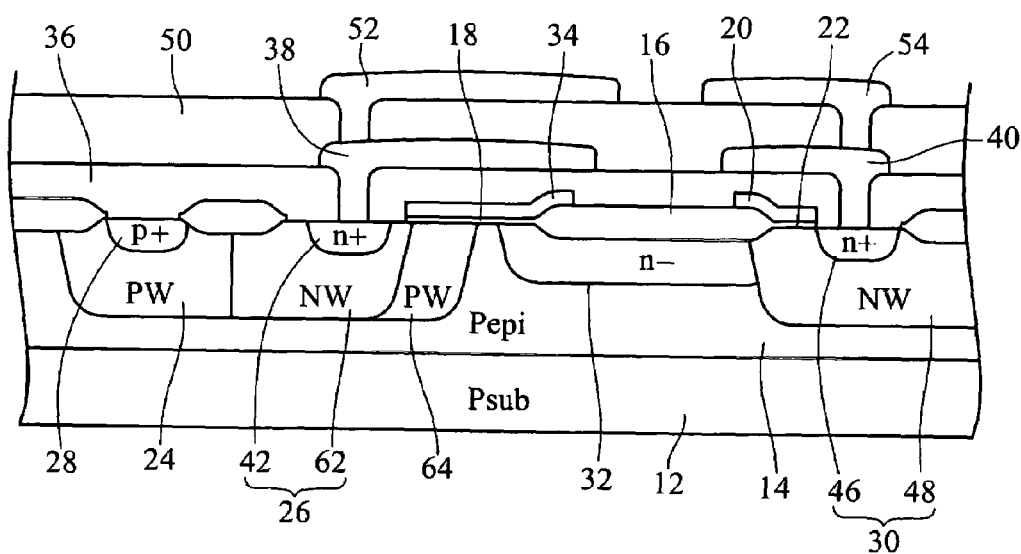
FIG. 8 is an LDMOS structure defined by source electrode region variation according to the fourth embodiment of the invention.

Please refer to FIG. 8, which shows the LDMOS structure defined by the source electrode variations according to the fourth embodiment of the invention.

As shown in FIG. 8, except for the source electrode region, the other elements, such as the drain electrode region of the LDMOS structure, are similar to those as shown in FIGS. 3 and 4. As such, they will not be repeated here for brevity's sake. In addition, similar numerals are utilized for the elements similar to those as shown in the previous drawings.

The above-mentioned LDMOS structure is formed in the P-type epitaxy layer, 14 located on the P-type substrate 12.

The characteristics of this particular LDMOS structure are: the said LDMOS structure includes two P wells 24,64 and an N source electrode region 26 located in the epitaxy layer 14; wherein the two P wells 24,64 are closely adjacent to the two sides of the said N source electrode region 26; the p+ region 28 is located in a P well 24 closely adjacent to the outer side of the N source electrode region 26. In addition, the said N source electrode region 26 may include an n+ region, 42 extending downwards from the surface of the said P-type epitaxy layer 14, and an N well 62, encircling the said n+ region 42.

In the above-mentioned FIGS. 5–8, the manufacturing method is similar to those as shown in FIG. 3 except for the N drain electrode region, as such it will not be repeated here for brevity's sake. Besides, the ions selected to use in the above-mentioned ion implementation process are for example Ar or B. Since the method utilized to form the P well, the p+ region, the n-region, the N well, the n+ region and the n-type drift layer in the specific region are prior arts, they will not be repeated here for brevity's sake.

The embodiment of the LDMOS structure defined by the variations of the source electrode region as shown in FIGS. 5–8 may be used in cooperation with the embodiment as shown in FIG. 4.

Figure 1:
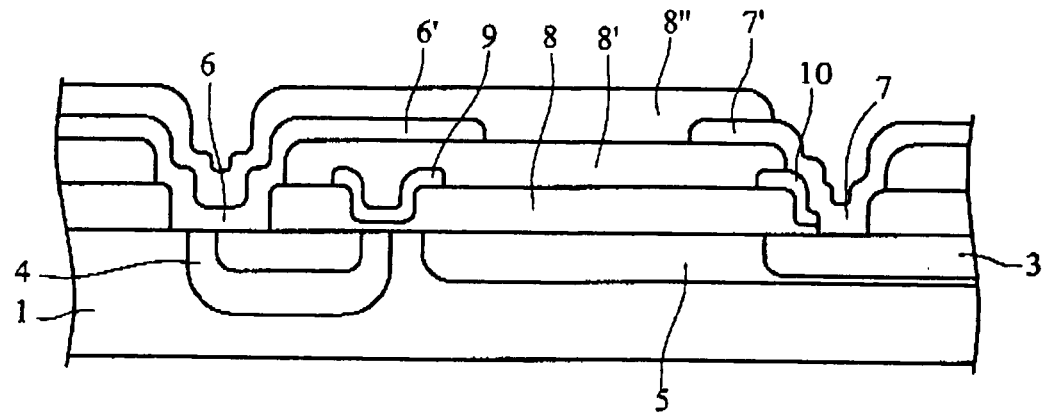
FIG. 1 is a schematic diagram of a cross section of conventional high voltage MOS structure.
Figure 2:
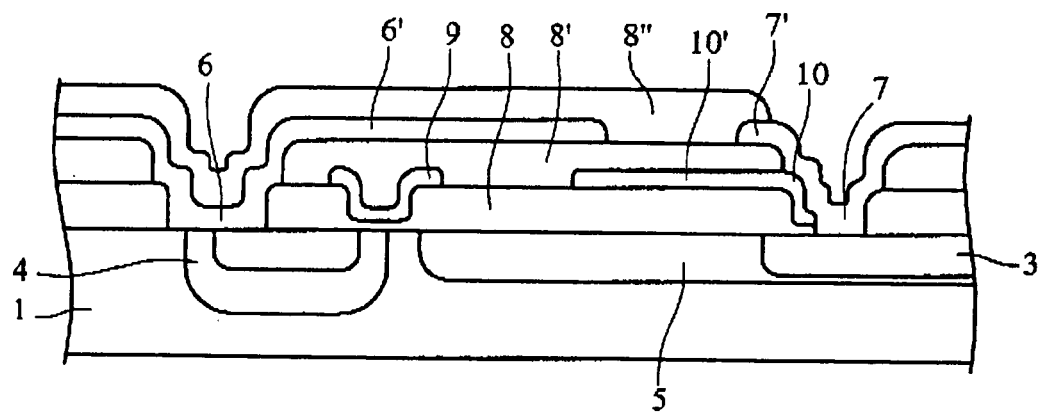
FIG. 2 is a schematic diagram of a cross section of the MOS structure according to U.S. Pat. No. 4,614,959.
Figure 9:
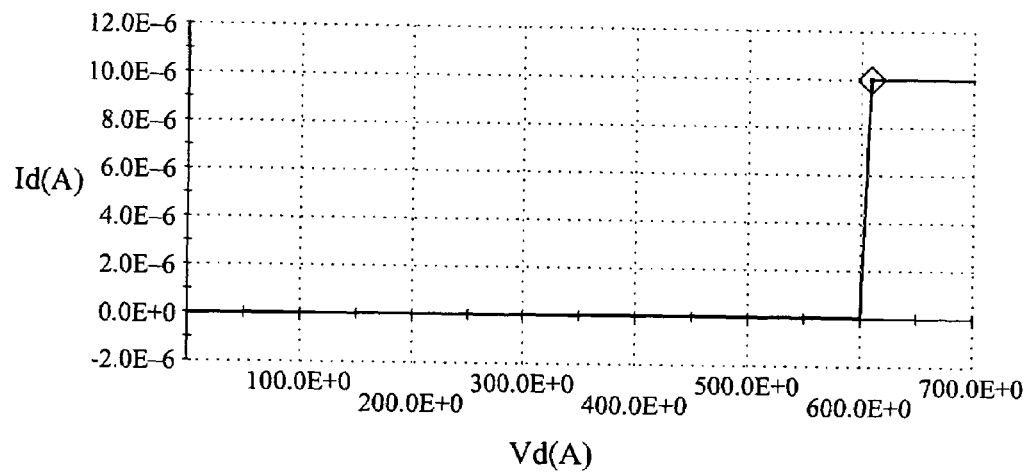
FIGS. 9 & 10 indicate respectively the results of experiment data of a conventional LDMOS structure & LDMOS structure of the invention at breakdown voltages.
Figure 10:
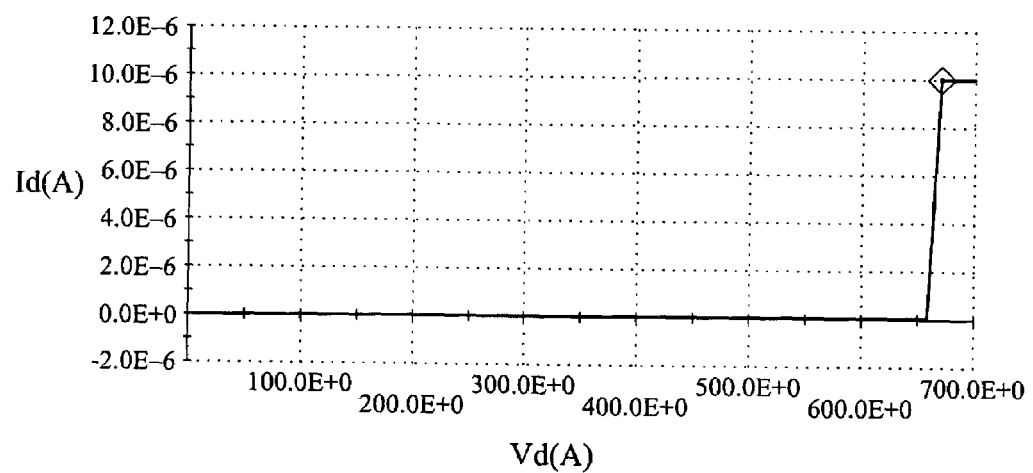

In addition, please refer to FIGS. 9 and 10, which show respectively the results of experiment data of the structure of the prior art in FIG. 1 and the LDMOS structure of the invention at breakdown voltages. Comparing the two diagrams, it is evident that the invention does have the effect of increasing the breakdown voltage, and it is further proved that by utilizing a multi-layer metal plate layer, coated on the drain electrode of a high electric field, the field concentration at sharp points can be reduced, thus achieving a uniform electric field.

The preferred embodiments of the invention have thus been described above. It should be noted that the scope of the invention is only restricted by the Claims, and it is in no way restricted by the above-mentioned embodiments. For example, the above-mentioned semiconductor structure can easily be converted to a PMOS by changing the N type region to a P type region, and by changing the P type region to an N type region.

Summing up the above, it is evident that utilizing the source electrode metal layer protruding out of the gate electrode and electric conduction layer, and utilizing the drain electrode metal layer covering the gate electrode and part of the drift layer, has the effect of reducing field concentration between interfaces. In addition, the field intensity between interfaces can be further reduced by utilizing the above-mentioned arrangement in conjunction with the source electrode region comprising an n+ region being surrounded by an n-region.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A high voltage laterally double-diffused metal oxide semiconductor (LDMOS) structure, comprising:
    a semiconductor layer having a first conductive type;
    a drift layer having a second conductive type and formed in the semiconductor layer, the drift layer extends downward a distance from the surface of the semiconductor layer;
    a source electrode region having the second conductive type and formed in the semiconductor layer, including a first region extending downward from the surface of the semiconductor layer, and a second region enclosing the first region, wherein the doping concentration of the first region is greater than that of the second region;
    a channel region, disposed between the source electrode region and a first edge of the drift layer;
    a drain electrode region of the second conductive type and formed in the semiconductor layer, and adjacent to a second edge of the drift layer;
    a first insulation layer formed on the semiconductor layer;
    a first gate electrode formed on the first insulation layer;
    a second gate electrode formed on the first insulation layer and separated from the first gate electrode;
    a second insulation layer and a third insulation layer formed on the first gate electrode and the second gate electrode and overlapping each other;
    a first source electrode metal layer, connected to the source electrode region and located over the first gate electrode, which is disposed between the second insulation layer and the third insulation layer, and another second source electrode metal layer is connected to the first source electrode metal layer extending on the third insulation layer, the second source electrode metal layer protrudes out a certain length relative to the first source electrode metal layer and overlaps a portion of the drift layer wherein, longitudinally, the length of the second source electrode metal layer overlaps a part of the drift layer, the overlap of the second source electrode metal layer being longer than an overlap of the first source electrode metal layer; and
    a first drain electrode metal layer, connected to the drain electrode region and located over the second gate electrode, which is disposed between the second insulation layer and the third insulation layer, and another second drain electrode metal layer is connected to the first drain electrode metal layer extending on the third insulation layer, the second drain electrode metal layer protrudes out a certain length relative to the first drain electrode metal layer and overlaps a portion of the drift layer, wherein, longitudinally, the length of the second drain electrode metal layer overlaps a part of the drift layer, the overlap of the second drain electrode metal layer being longer than an overlap of the first drain electrode metal layer.

2. The high voltage laterally double-diffused metal oxide semiconductor (LDMOS) structure of claim 1, wherein the drain electrode region includes a third region extending downward from the surface of the semiconductor layer, and a fourth region enclosing the third region, wherein the doping concentration of the third region is greater an that of the fourth region.

3. The high voltage laterally double-diffused metal oxide semiconductor (LDMOS) structure of claim 1, further comprising a region having the first conduction type, extending downward from the surface of the semiconductor layer, being separated from the source electrode region, and being formed on the outer side of the source electrode region.

4. The high voltage laterally double-diffused metal oxide semiconductor (LDMOS) structure of claim 3, further comprising a region well having the first conduction type and being formed in the semiconductor layer, extending downward from the surface of the said semiconductor layer, and enclosing the source electrode region and the region having the first conduction type.

5. The high voltage laterally double-diffused metal oxide semiconductor (LDMOS) structure of claim 3, further comprising a region well laving the first conduction type and being formed in the semiconductor layer, extending downward from the surface of the semiconductor, and enclosing the region having the first conduction type.

6. The high voltage laterally double-diffused metal oxide semiconductor (LDMOS) structure of claim 3, further comprising a region well having the first conduction type and being formed in the semiconductor layer, extending downward from the surface of the semiconductor layer, and enclosing part of the source electrode region and the region having the first conduction type.

7. The high voltage laterally double-diffused metal oxide semiconductor (LDMOS) structure of claim 3, further comprising a region well having the first conduction type and being formed in the semiconductor layer, extending downward from the surface of the semiconductor layer, enclosing the region having the first conduction type, and adjoining one side of the source electrode region.

8. The high voltage laterally double-diffused metal oxide semiconductor (LDMOS) structure of claim 7, further comprising another region well having the first conduction type and being formed in the semiconductor layer, extending downward from the surface of the semiconductor layer and adjoining the other side of the source electrode region.

9. The high voltage laterally double-diffused metal oxide semiconductor (LDMOS) structure of claim 1, wherein the first conduction type is P type and the second conduction type is N type.

10. The high voltage laterally double-diffused metal oxide semiconductor (LDMOS) structure of claim 1, wherein the semiconductor layer is an epitaxy layer, formed on a substrate having the first conduction type.

11. The high voltage laterally double-diffused metal oxide semiconductor (LDMOS) structure of claim 1, wherein the certain length of the second source electrode metal layer protruding out is between 5% and 20% of the drift layer disposed below.

12. The high voltage laterally double-diffused metal oxide semiconductor (LDMOS) structure of claim 1, wherein the certain length of the second drain electrode metal layer protruding out is between 5% and 20% of the drift layer disposed below.

* * * * *